(12) United States Patent
Taracila et al.

(10) Patent No.: US 8,378,681 B2
(45) Date of Patent: Feb. 19, 2013

(54) MULTIPLE-FREQUENCY RF TRAP AND MRI SYSTEM

(75) Inventors: Victor Taracila, Aurora, OH (US);
James S. Tropp, Fremont, CA (US);
Fraser J. Robb, Aurora, OH (US);
Robert Carl Minnich, Cortland, OH (US)

(73) Assignee: General Electric Company, Schenectady, NY (US)

( * ) Notice: Subject to any disclaimer, the term of this patent is extended or adjusted under 35 U.S.C. 154(b) by 641 days.

(21) Appl. No.: 12/639,370

(22) Filed: Dec. 16, 2009

(65) Prior Publication Data

US 2011/0140700 A1   Jun. 16, 2011

(51) Int. Cl.
*G01V 3/00* (2006.01)
(52) U.S. Cl. ............................. 324/318; 324/322
(58) Field of Classification Search .............. 324/318, 324/319, 322
See application file for complete search history.

(56) References Cited

U.S. PATENT DOCUMENTS

| 4,742,304 A * | 5/1988 | Schnall et al. ............ 324/318 |
| 4,922,204 A * | 5/1990 | Duerr et al. ............... 324/322 |
| 5,243,289 A * | 9/1993 | Blum et al. ................ 324/322 |
| 6,593,744 B2 | 7/2003 | Burl et al. |

* cited by examiner

*Primary Examiner* — Louis Arana

(57) ABSTRACT

A multiple-frequency RF trap and an MRI system including a multiple-frequency RF trap. The multiple-frequency RF trap being tuned to block RF energy at two frequencies.

19 Claims, 6 Drawing Sheets ately 31 MHz for C13. Using conventional designs, RF
MULTIPLE-FREQUENCY RF TRAP AND MRI SYSTEM

FIELD OF THE INVENTION

This disclosure relates generally to an RF trap and an MRI system that is tuned to block RF energy at two different frequency bands.

BACKGROUND OF THE INVENTION

Magnetic resonance imaging (MRI) is a medical imaging modality that can create images of the inside of a human body without using x-rays or other ionizing radiation. MRI uses a powerful magnet to create a strong, uniform, static magnetic field. When a human body, or part of a human body, is placed in the main magnetic field, the nuclear spins that are associated with the hydrogen nuclei in tissue or fat become polarized. This means that the magnetic moments that are associated with these spins become preferentially aligned along the direction of the main magnetic field, resulting in a small net tissue magnetization along that axis. An MRI system also comprises components called gradient coils that produce smaller amplitude, spatially varying magnetic fields when a current is applied to them. Typically, gradient coils are designed to produce a magnetic field component that is aligned along the z-axis and that varies linearly in amplitude with position along one of the x, y, or z-axes. The effect of a gradient coil is to create a small ramp on the magnetic field strength and, in turn, on the resonant frequency of the nuclear spins along a single axis. Three gradient coils with orthogonal axes are used to "spatially encode" the MRI signal by creating a signature resonance frequency at each location in the body. Typically a radio frequency (RF) body coil is used to create pulses of RF energy at or near the resonance frequency of the hydrogen nuclei. The RF body coil is used to add energy to the nuclear spins in a controlled fashion. As the nuclear spins then relax back to their rest energy state, they give up energy in the form of an RF signal. The RF signal is detected by one or more RF receive coils and is transformed into an image using a computer and known reconstruction algorithms.

In order to work most effectively, it is important that the RF receive coils are isolated from electrical noise and stray currents. The RF receive coils typically pass the RF signal to a processor in the MRI system by way of one or more coaxial cables. Even though the coaxial cables typically include a layer of conductive shielding, it is possible for currents to be induced on the outer conductive shielding during transmit and receive phases. These induced currents distort the original transmit or receive fields and need to be minimized for optimal imaging. In addition to degrading the image quality, having excessive RF current on the coaxial cables can lead to overheating within the RF receive coils. Since the RF receive coils are typically placed very close to the patient, overly high temperatures can also lead to patient discomfort. A typical technique used to eliminate stray or induced currents on the conductive shielding of the coaxial cables involves creating a high impedance by placing multiple RF traps along the conductive shielding of the coaxial cables.

In a conventional MRI system, each RF trap is typically tuned to a single frequency. For example, in a 3T MRI system, each RF trap is tuned so that it creates a high impedance at the resonance frequency of H (hydrogen), which is around 128 MHz. However, recent developments have shown that a double-tuned RF coil could be useful for creating images at more than one resonant frequency. For example, some of the double-tuned RF coils are used to obtain RF signals from both hydrogen and C13 (carbon 13). In order to eliminate the problems associated with excess RF current on the coaxial cable, it is necessary to have RF traps to eliminate excess current at the resonant frequency of H and at the resonant frequency of C13. For a 3T system, this equates to a resonant frequency of approximately 128 MHz for H and approximately 31 MHz for C13. Using conventional designs, RF traps tuned to 128 MHz and separate RF traps tuned to 31 MHz would be needed for the coaxial cables of a 3T MRI system using a double-tuned RF coil. However, modern MRI systems are very tightly packaged, particularly in the region surrounding the RF coil and associated coaxial cables. It is clear that simply increasing the number of RF traps will lead to wasting unnecessary space. Also, since there is a desire both to keep the patient bore as large as possible for patient comfort and to have the smallest possible magnet to minimize the cost of the MRI system, it is clearly undesirable to add additional space-consuming RF traps to existing designs. Therefore, in order to address these problems as well as others, there is a need for an RE trap that is tuned for multiple resonant frequencies.

BRIEF DESCRIPTION OF THE INVENTION

The above-mentioned shortcomings, disadvantages and problems are addressed herein which will be understood by reading and understanding the following specification.

In an embodiment, a multiple-frequency RF trap for one or more shielded cables includes a first cylindrical member disposed around the one or more shielded cables. The first cylindrical member includes a first conductive cylinder and a first capacitive component electrically connected to the first conductive cylinder. The first cylindrical member is electrically connected to a cable shield surrounding the one or more shielded cables. The multiple-frequency RF trap includes a second cylindrical member disposed around the first cylindrical member. The second cylindrical member includes a second conductive cylinder and a second capacitive component electrically connected to the second conductive cylinder. The second cylindrical member is electrically connected to the cable shield. The multiple-frequency RF trap also includes an outer shield surrounding the second conductive cylinder. The outer shield is electrically connected to the cable shield.

In an embodiment, a multiple-frequency RF trap for an MRI system includes a first former with a first conductive path in the shape of a first discontinuous figure-eight. The first former is adapted to receive one or more cables wrapped in a first figure-eight pattern. The multiple-frequency RF trap includes a first capacitive component electrically connected to the first former, where the first capacitive component completes a first LC circuit with the first former. The first LC circuit is tuned to a first RF frequency. The multiple-frequency RF trap includes a second former with a second conductive path in the shape of a second discontinuous figure-eight, where the second former is adapted to receive one or more cables wrapped in a second figure-eight pattern. The second former is positioned at a generally perpendicular angle to the first former. The multiple-frequency RF trap also includes a second capacitive component electrically connected to the second former, where the second capacitive component completes a second LC circuit with the second former. The second LC circuit is tuned to a second RF frequency.

In another embodiment, an MRI system includes a superconducting main coil configured to generate a B0 field, an RF body coil disposed inside the superconducting main coil, and at least one cable connected to the RF body coil. The MRI system also includes a multiple-frequency RF trap affixed to the at least one cable. The multiple-frequency RF trap is tuned to block RF energy at two discrete frequency bands.

Various other features, objects, and advantages of the invention will be made apparent to those skilled in the art from the accompanying drawings and detailed description thereof.

DETAILED DESCRIPTION OF THE INVENTION

In the following detailed description, reference is made to the accompanying drawings that form a part hereof, and in which is shown by way of illustration specific embodiments that may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken as limiting the scope of the invention.

Figure 1:
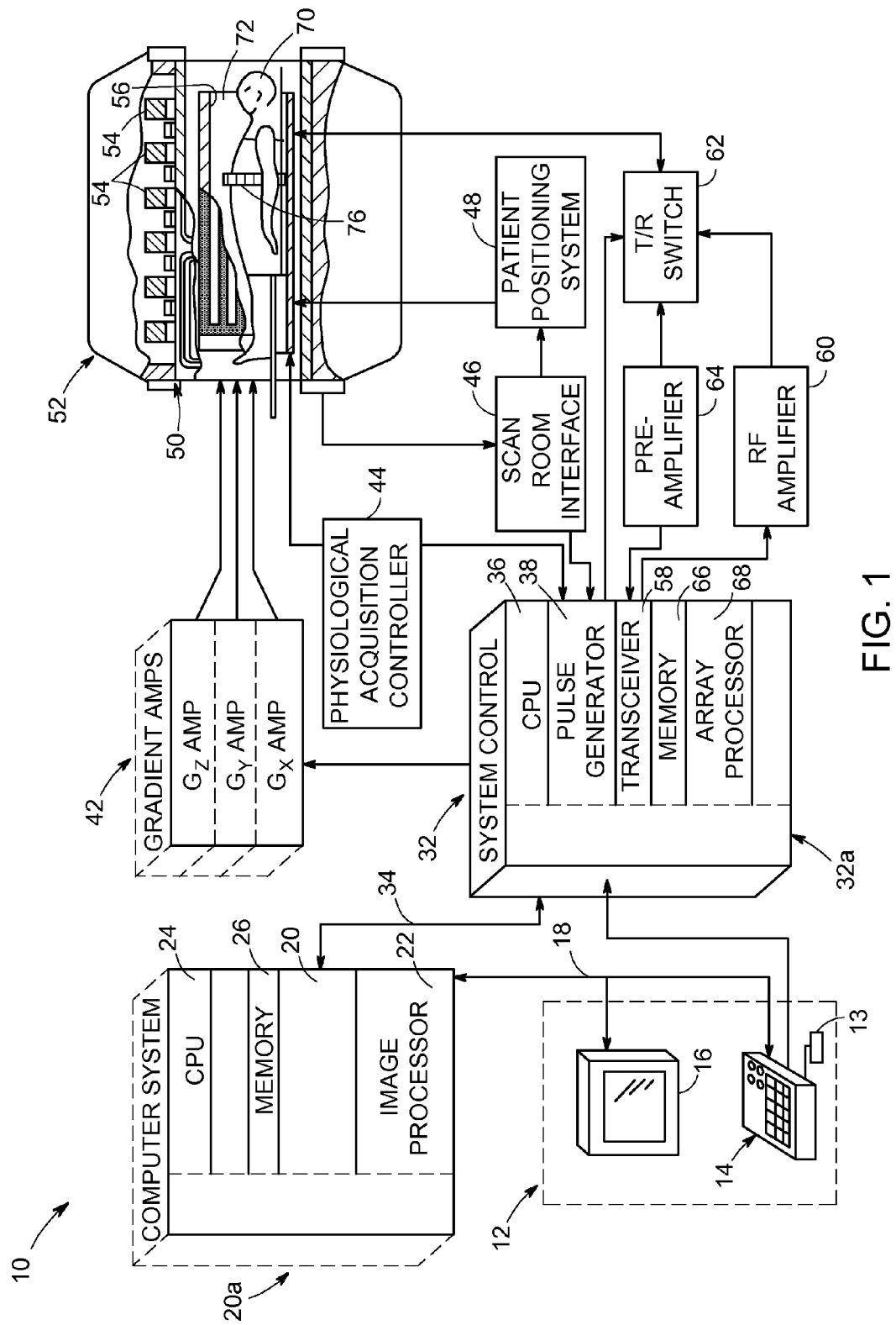
FIG. 1 is a schematic representation of a magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$, and $G_z$ amplifiers. Each gradient amplifier excites a corresponding physical gradient coil in a gradient coil assembly 50 generally designated to produce the magnetic field gradient pulses used for spatially encoding acquired signals. The gradient coil assembly 50 forms part of a resonance assembly 52 that includes a polarizing superconducting magnet. Resonance assembly 52 may include an RF body coil 56, surface or local RF coils 76 or both. The coils 56, 76 of the RF coil assembly may be configured for both transmitting and receiving, for transmit-only, or for receive-only. The surface coils 76 can be an array of RF surface coils in which each coil (or coil element) separately detects the MRI signals. Such RF surface coil arrays are well-known in the art.

A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by either of the RF coils 56, 76 and coupled through the transmit/receive switch 62 to a preamplifier 64. The amplified MR signals are demodulated, filtered and digitized in the receiver section of the transceiver 58. The transmit/receive switch 62 is controlled by a signal from the pulse generator module 38 to electrically connect the RF amplifier 60 to the RF body coil 56 during the transmit mode and to connect the preamplifier 64 to the RF body coil 56 during the receive mode. The transmit/receive switch 62 can also enable a separate RF coil (for example, a parallel or surface coil 76) to be used in either the transmit or receive mode.

The MR signals sensed by the RF body coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

As mentioned above, an RF body coil 56 may be used in a transmit mode to transmit RF excitation signals and a surface coil or coils (e.g., an array of surface coils) 76 may be used in a receive mode to detect the signals emitted by the subject. A decoupling circuit (or circuits) is provided to decouple, or disable, the surface coil or coils during the transmit mode when the RF body coil 56 is transmitting RF excitation signals. In an embodiment where a plurality (or array) of surface coils is used, a decoupling circuit may be provided for each surface coil.

Figure 2:
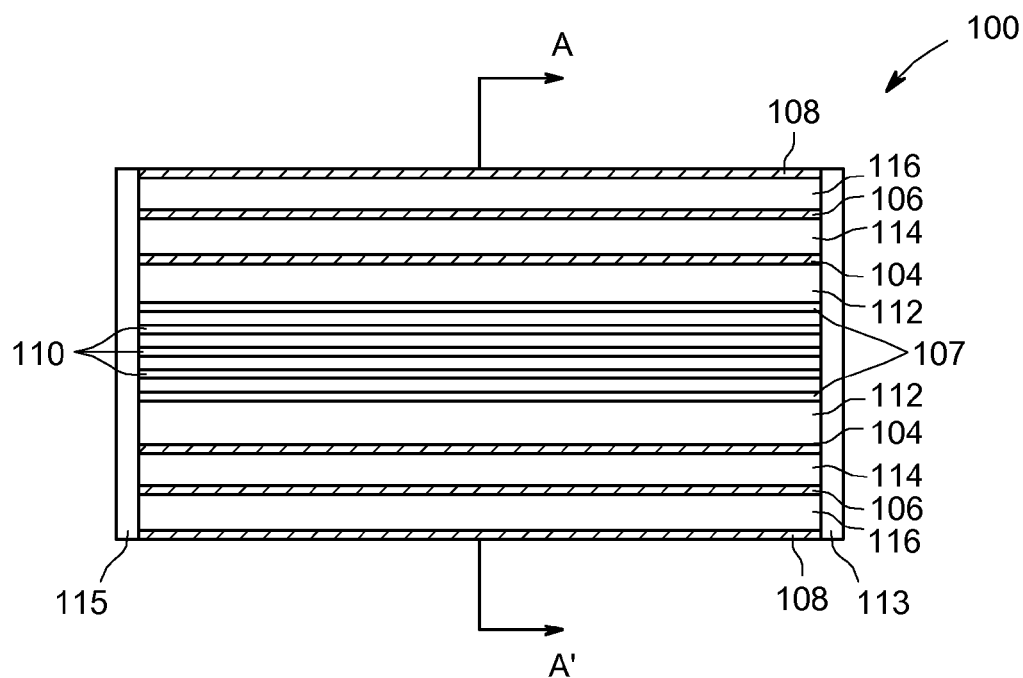
FIG. 2 is a schematic representation of a multiple-frequency RF trap in accordance with an embodiment.

Referring to FIG. 2, a schematic representation of a sectional view of a multiple-frequency RF trap in accordance with an embodiment is shown. The multiple-frequency RF trap 100 includes a first cylindrical member 104, a second cylindrical member 106, and an outer shield 108.

The embodiment shown in FIG. 2 includes a cable shield 107 surrounding a plurality of coaxial cables 110. The cable shield 107 comprises a cylindrical structure formed from a conductive material such as copper. The cable shield 107 functions to keep magnetic fields from inducing current in the plurality of coaxial cables 110. The first cylindrical member 104 comprises a cylindrical structure formed from a conductive material such as copper and a first capacitive component 120 (shown in FIG. 4). The first cylindrical member 104 is disposed around the cable shield 107. A first insulating layer 112 separates the cable shield 107 from the first cylindrical member 104. According to an embodiment the first insulating layer 112 may comprise air or another material that is not electrically conductive. The first cylindrical member 104 is electrically connected to the cable shield through a first conductive end piece 113 and a second conductive end piece 115. Other embodiments may use additional methods of electrically connecting the first cylindrical member 104 to the cable shield 107. The first cylindrical member 104 will be discussed in detail hereinafter.

Figure 4:
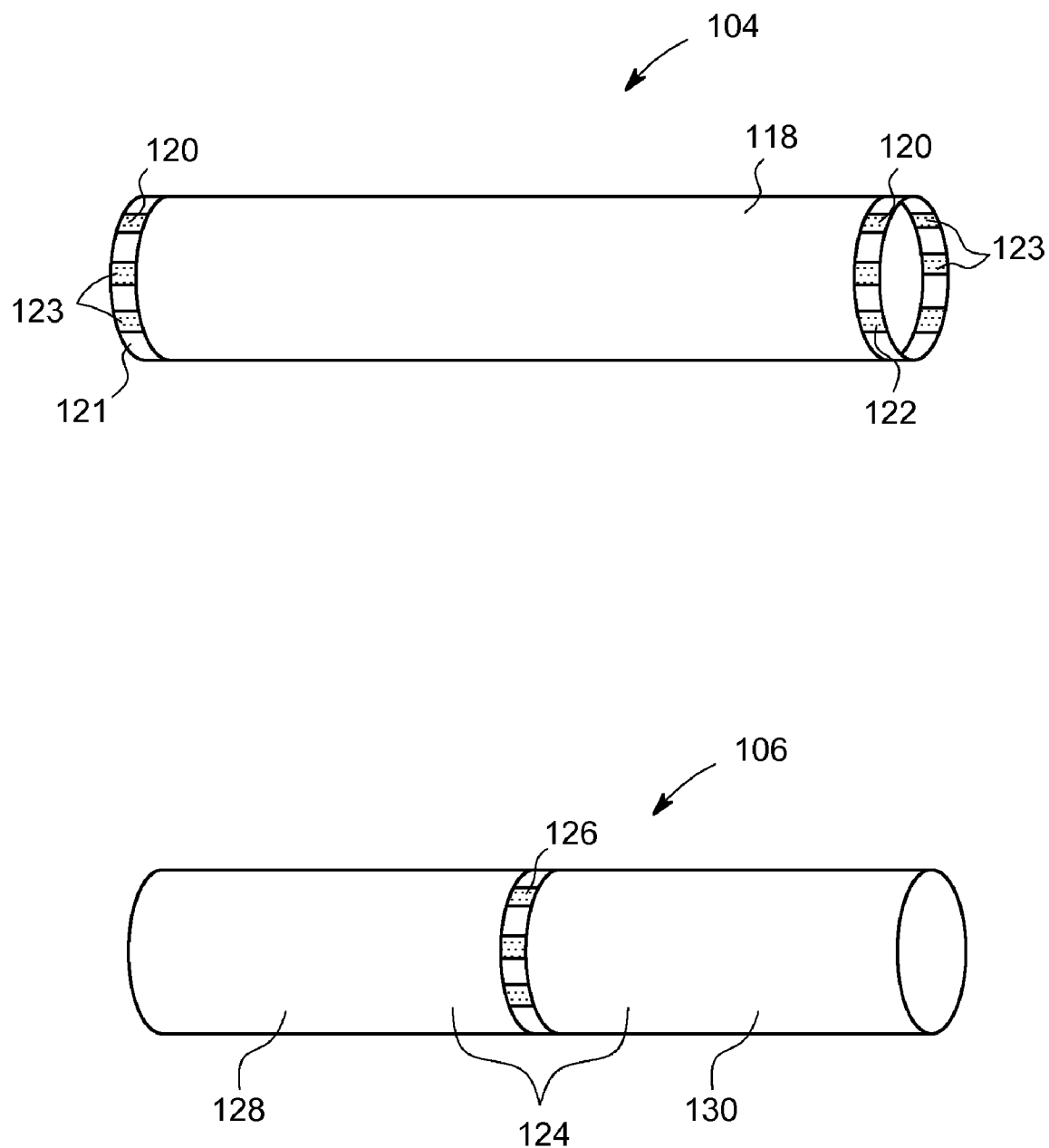
FIG. 4 is a schematic representation of perspective views of a first cylindrical member and a second cylindrical member in accordance with an embodiment.

The second cylindrical member 106 comprises a cylinder formed of a conductive material such as copper and a second capacitive component 126 (shown in FIG. 4). A second insulating layer 114 is disposed between the first cylindrical member 104 and the second cylindrical member 106. The second insulating layer 114 may comprise air or another material that is not electrically conductive. The second cylindrical member 106 is also electrically connected to the cable shield 107 through the first conductive end piece 113 and the second conductive end piece 115. Other embodiments may use additional methods of electrically connecting the second cylindrical member 106 to the cable shield 107. The second cylindrical member 106 will be discussed in detail hereinafter.

The outer shield 108 is disposed outside of the second cylindrical member 106. According to an embodiment, the outer shield 108 is separated from the second cylindrical member 106 by a third insulating layer 116. The third insulating layer 116 may comprise air or another electrically insulating material. The outer shield 108 is electrically connected to the cable shield 107 by the first conductive end piece 113 and the second conductive end piece 115.

Figure 3:
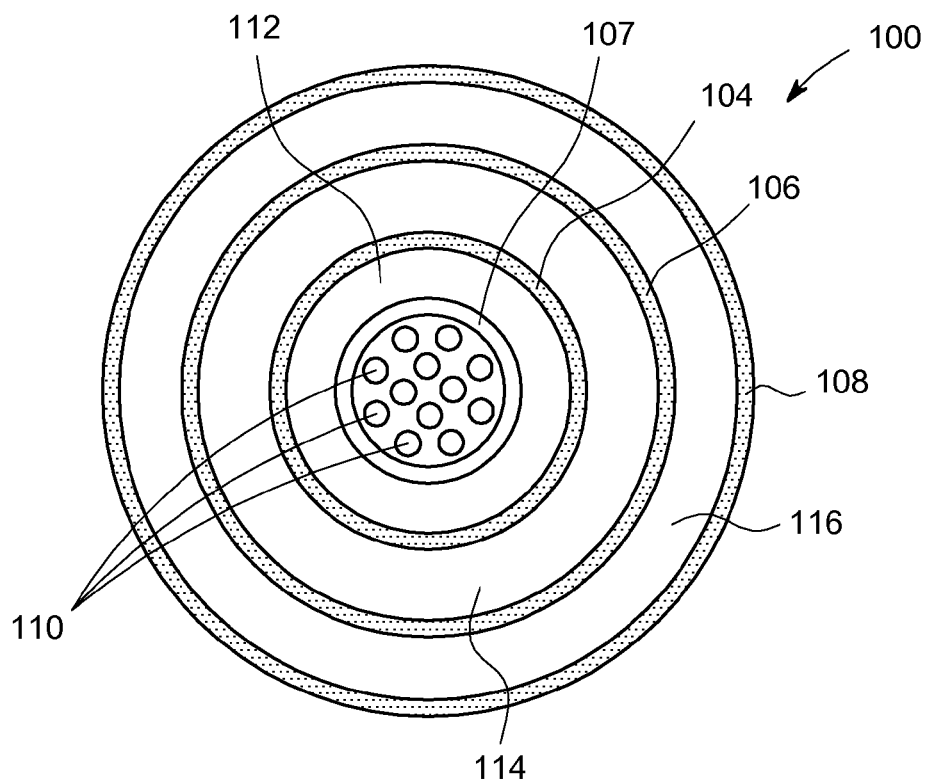
FIG. 3 is a schematic cross-sectional view of a multiple-frequency RF trap.

FIG. 3 is a schematic cross-sectional view of the multiple-frequency RF trap 100 from FIG. 2 along line A-A'. Common reference numbers have been used to indicate structures that are identical between FIG. 2 and FIG. 3. FIG. 3 shows how the first cylindrical member 104, the second cylindrical member 106, and the outer shield 108 are concentrically disposed around the plurality of coaxial cables 110.

Referring to FIG. 4, schematic representations of perspective views of a first cylindrical member and a second cylindrical member are shown in accordance with an embodiment. Common reference numbers will be used to identify elements that are identical to those shown in FIG. 2 and FIG. 3. The first cylindrical member 104 may comprise a first conductive cylinder 118 and a first capacitive component 120. The first capacitive component 120 may include a pair of rings. According to the embodiment shown in FIG. 3, a first ring 121 is located at a first end of the first conductive cylinder 118 and a second ring 122 is located at a second end. Each ring comprises a plurality of capacitors 123. For instance, each ring may comprise 6 individual capacitors 123 in accordance with an embodiment. The capacitive values of the individual capacitors 123 in the first capacitive component 120 are selected so that a first circuit formed by the cable shield 107 (shown in FIG. 2) and the first cylindrical member 104 achieves resonance at a desired frequency. The resonant frequency depends on both the element used to generate the MRI image as well as the strength of the magnetic field. The tuning of a circuit formed by a conductive cylinder, a capacitive component and a cable shield to a single frequency is well-known by those skilled in the art and will therefore not be discussed in detail. It should be appreciated by those skilled in the art that it may be necessary to take any other capacitive components of the RF trap into consideration when selecting the values of the capacitive component as will be discussed hereinafter. According to an exemplary embodiment, the first capacitive component 120 may have a capacitance selected so that the first circuit resonates at approximately 128 MHz, which corresponds to the resonant frequency of hydrogen in a 3T magnetic field.

Still referring to FIG. 4, the second cylindrical member 106 comprises a second conductive cylinder 124 and a second capacitive component 126. The second cylindrical member 106 includes a first cylindrical section 128 and a second cylindrical section 130 according to an embodiment. The first cylindrical section 128 may be separated from the second cylindrical section 130 by the second capacitive component 126 as shown in FIG. 3. The second capacitive component 126 may comprise a plurality of individual capacitors as shown in FIG. 3. The capacitance of the second capacitive component 126 is selected so that a circuit comprising the cable shield 107 (shown in FIG. 2), the second conductive cylinder 124, and the second capacitive component 126 resonates at the desired frequency. According to an embodiment, the second capacitive component 126 may be selected with a capacitance so that the circuit resonates at 31 MHz, which corresponds to the resonant frequency of C13 in a 3T magnetic field. It may be necessary to take any other capacitive components of the RF trap into consideration when selecting the value of the second capacitive component 126. For example, when determining the appropriate value of the second capacitive component 126, it may be necessary to factor in the effects of the first capacitive component 120 and the first circuit on the second circuit. Likewise, when determining the appropriate value of the first capacitive component 120, it may be necessary to factor in the effects of the second capacitive component 126 and the second circuit. According to one embodiment, RF circuit modeling software may be used to predict the approximate values of the first capacitive component 120 and the second capacitive component 126. The exact values of the first capacitive component 120 and the second capacitive component 126 may be empirically refined once a working model of the RF trap has been constructed. It should be appreciated by those skilled in the art that other well-known techniques of selecting values of the first capacitive component 120 and the second capacitive component 126 may be used in accordance with other embodiments. Both the first capacitive component 120 and the second capacitive component 126 may comprise different designs according to other embodiments. The positioning and dimensions of the first capacitive component and the second capacitive component are not critical. However, the first capacitive component 120 must have a capacitance that tunes the first circuit to resonate at a first desired frequency and the second capacitive component 126 must have a capacitance that tunes the second circuit to resonate at a second desired frequency that is distinct from the first desired frequency.

Figure 5:
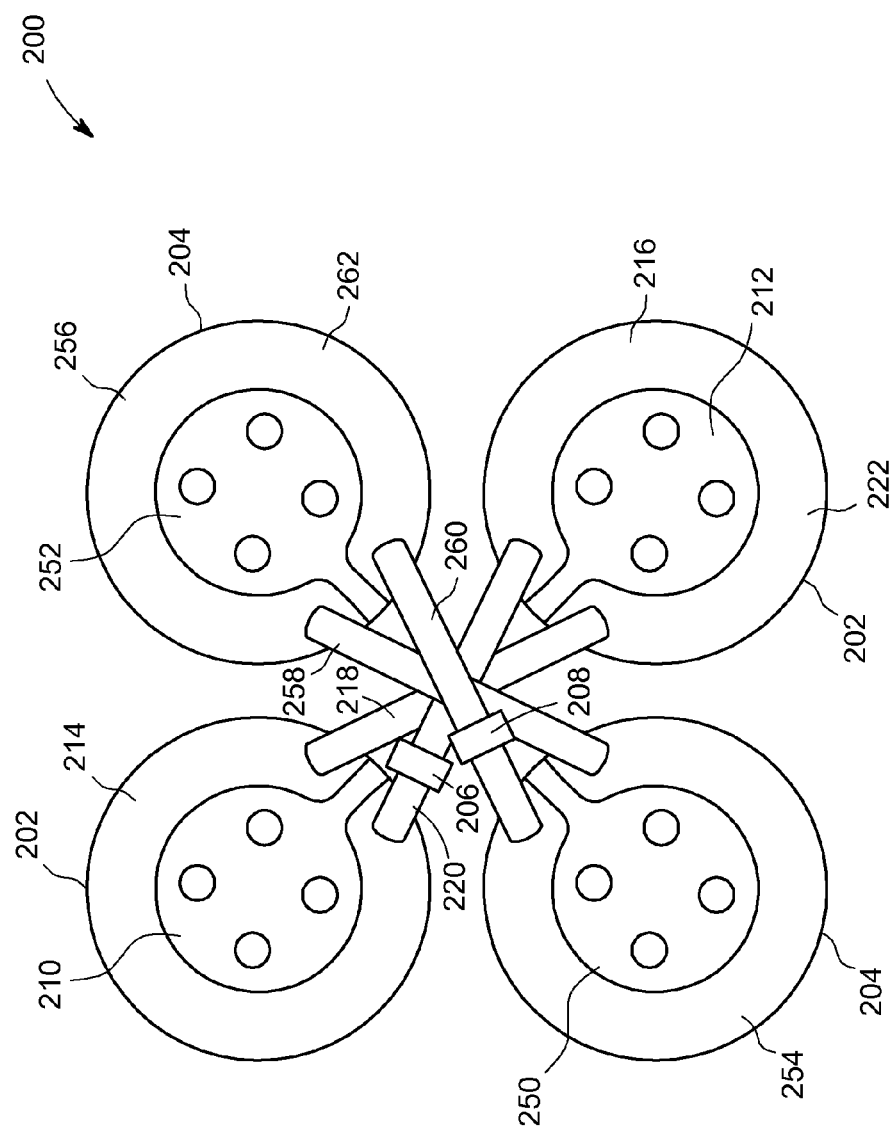
FIG. 5 is a schematic representation of a multiple-frequency RF trap in accordance with an embodiment.

FIG. 5 is a schematic representation of a top view of a multiple-frequency RF trap 200 in accordance with an embodiment. The multiple-frequency RF trap 200 includes a first former 202, a second former 204, a first capacitive component 206, and a second capacitive component 208. The first former 202 includes a first spool 210 and a second spool 212. The first spool 210 includes a first electrically conductive portion 214 and the second spool 212 includes a second electrically conductive portion 216. The spools (210, 212) will be discussed further hereinafter. The first electrically conductive portion 214 is electrically connected to the second electrically conductive portion 216 by a first conductive strip 218. A second conductive strip 220 connects the first electrically conductive portion 214 to the second electrically conductive portion 216. The second conductive strip 220 is electrically interrupted by the first capacitive component 206.

The first electrically conductive portion 214, the second electrically conductive portion 216, the first conductive strip 218, and the second conductive strip 220 together form a first conductive path 222. The first conductive path 222 is in the form of a discontinuous figure-eight. Details of a discontinuous figure-eight will be discussed hereinafter. The combination of the first conductive path 222 and the first capacitive component 206 forms a first LC circuit. The value of the first capacitive component 206 is selected so that the first LC circuit resonates at a first RF frequency. The value of the first capacitive component 206 may be selected using conventional modeling software as is well-known by those skilled in the art.

The second former 204 of the multiple-frequency RF trap 200 shown in FIG. 5 includes a third spool 250 and a fourth spool 252. The third spool 250 includes a third electrically conductive portion 254 and the fourth spool 252 includes a fourth electrically conductive portion 256. The third electrically conductive portion 254 is connected to the fourth electrically conductive portion 256 by a third conductive strip 258 and a fourth conductive strip 260. The fourth conductive strip 260 is electrically interrupted by the second capacitive component 208. The combination of the third electrically conductive portion 254, the fourth electrically conductive portion 256, the third conductive strip 258, and the fourth conductive strip 260 collectively form a second conductive path 262. The second conductive path 262 is in the form of a second discontinuous figure-eight. Details of a discontinuous figure-eight will be discussed hereinafter.

Figure 6:
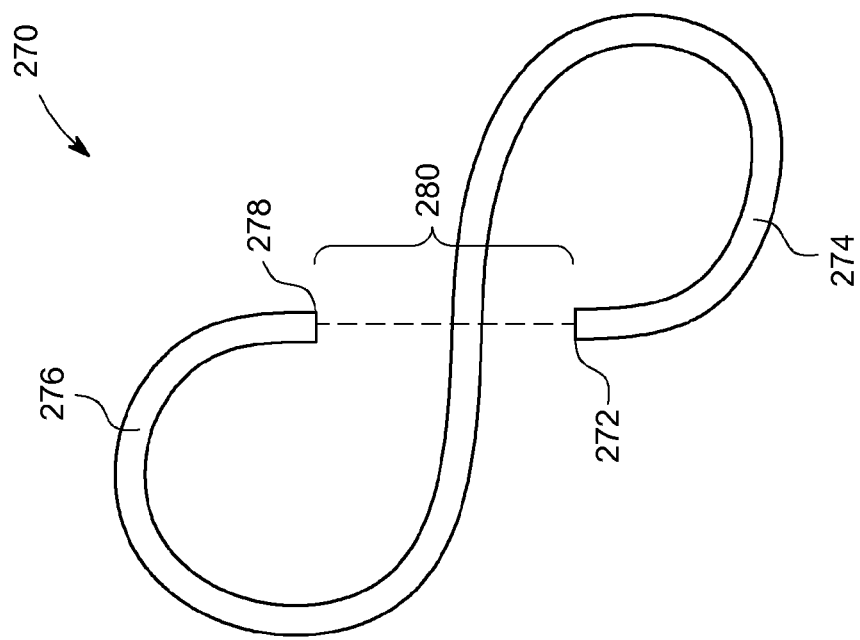
FIG. 6 is a schematic representation of a conductive path in accordance with an embodiment.

FIG. 6 shows a schematic representation of a conductive path 270 that is in the form of an exemplary discontinuous figure-eight. Starting at a first end 272, the conductive path 270 forms a first curve 274 in a counter-clockwise direction and then forms a second curve 276 in a clockwise direction until it reaches a second end 278. The first end 272 and the second end 278 are separated by a first distance 280. Those skilled in the art will appreciate that the conductive path 270 is an exemplary conductive path and that the conductive paths may vary according to other embodiments. For example, according to an embodiment, the first curve 274 may loop in a clockwise direction and the second curve 276 may loop in a counter-clockwise direction. Additionally, the first distance 280 between the first end 272 and the second end 278 may vary in accordance with other embodiments.

Figure 7:
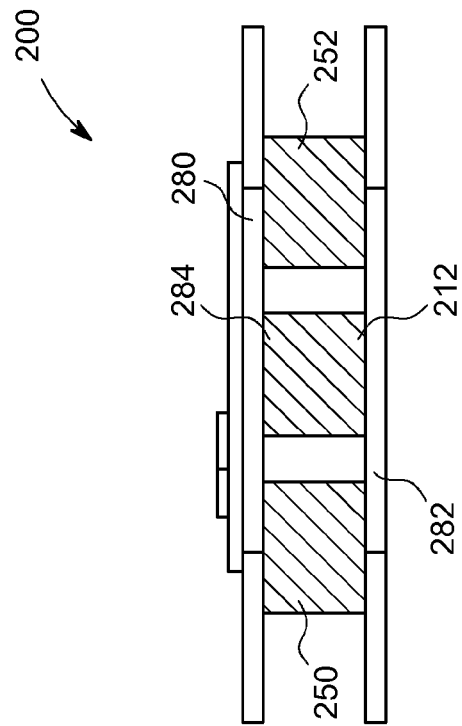
FIG. 7 is a is a schematic representation of a side-view of a multiple-frequency RF trap in accordance with an embodiment.

FIG. 7 is a schematic representation of a side-view of the multiple-frequency RF trap 200 from FIG. 5. Common reference numbers will be used to identify components that are identical between FIG. 5 and FIG. 7. FIG. 7 shows three of the 4 spools that are components of the multiple-frequency RF trap 200. The second spool 212, the third spool 250, and the fourth spool 252 are all clearly visible in FIG. 7. The first spool 210 (shown in FIG. 4) is not visible in FIG. 6 because it is obscured by the second spool 212. The second spool 212 includes a top plate 280, a bottom plate 282, and an inner cylinder 284. The inner cylinder 284, the top plate 280, and the bottom plate 282 may also include conductive portions to help couple the one or more cables to the first conductive path 222. The conductive portions of the inner cylinder 284, the top plate 280, and the bottom plate 282 may also be disposed in a discontinuous figure-eight pattern. Collectively, the inner cylinder 284, the top plate 280, and the bottom plate 282 form a channel adapted to receive one or more cables wrapped around the inner cylinder 284. The first spool 210 (shown in FIG. 5), the third spool 250, and the fourth spool 252 may all be structurally similar to the second spool 212 according to an embodiment. According to other embodiments, a first former and a second former may each be comprised of components other than those shown in FIG. 5. For example, a first former may be comprised of a single integral component according to an embodiment. The first former and the second former need to be able to at least partially receive one or more cables and include a conductive path in the shape of a discontinuous figure-eight.

Referring back to FIG. 5, an exemplary embodiment includes the first former 202 disposed at a generally perpendicular angle to the second former 204. For purposes of this disclosure the term "generally perpendicular angle" is defined to include an angle between a first line connecting the centers of the first discontinuous figure-eight to a second line connecting the centers of a second discontinuous figure-eight. In other words, a first line (not shown) connecting the center of the first spool 210 to the center of the second spool 212 would cross a second line (not shown) connecting the center of the third spool 250 to the center of the fourth spool 252 at a generally perpendicular angle. It is important that the first former 202 is at a generally perpendicular angle to the second former 204 in order to minimize coupling between the first former 202 and the second former 204. However it should be noted that the first former 202 and the second former 204 are both disposed in generally the same plane according to the embodiment shown in FIG. 5. That is, the first former 202 and the second former 204 both form loops of their respective discontinuous figure-eights within substantially the same plane.

However, according to other embodiments, a first former and a second former may be disposed in planes that are generally perpendicular to each other. For example, if a first former is disposed in an x-y-plane, a second former may be disposed in either the x-z-plane or the y-z-plane. According to an embodiment, the first former and a first capacitive element form a first LC circuit tuned to a first frequency, and the second former and a second capacitive element form a second LC circuit tuned to a second frequency. By positioning the first former in a plane that is perpendicular to the plane of the second former, it is possible to minimize the electromagnetic coupling between the first LC circuit and the second LC circuit.

Figure 8:
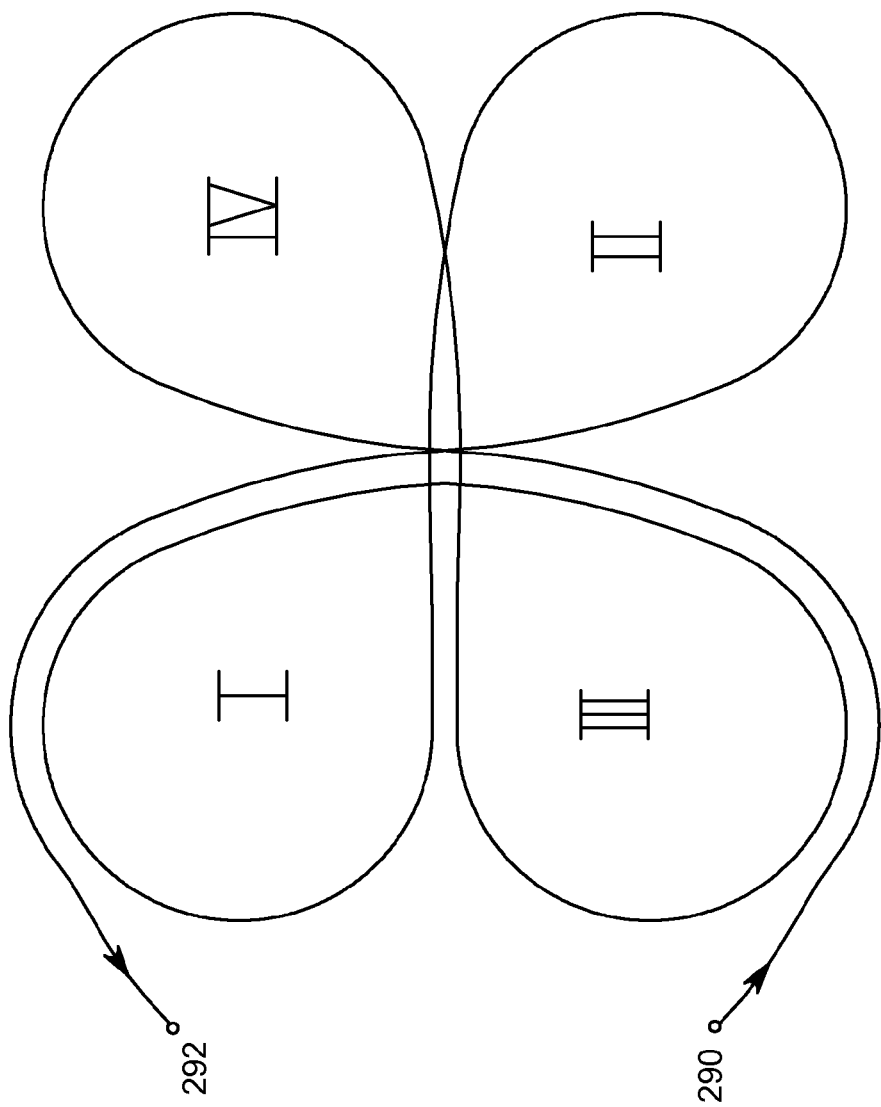
FIG. 8 is a schematic representation of a figure-eight pattern that may be used to wrap one or more cables around a multiple-frequency RF trap in accordance with an embodiment.

FIG. 8 is a schematic representation of an exemplary figure-eight pattern. One or more cables may be wrapped around a multiple-frequency RF trap in a figure-eight pattern, such as that shown in FIG. 8, in accordance with an embodiment. For the purposes of this disclosure, the term "figure-eight pattern" is defined to include a pattern where a section of wire or cable is wrapped to form a clockwise loop adjacent to a counter-clockwise loop. The positions of each of four spools, such as those shown in FIG. 5, are schematically represented by Roman Numerals on FIG. 8. Starting at point 290, one or more cables start around the third spool in a counter-clockwise direction. The one or more cables wrap around the fourth spool in a clockwise direction before wrapping back around the third spool in a counterclockwise direction. The one or more cables then wrap around the first spool in a counter-clockwise direction and cross over to wrap around the second spool in a clockwise direction. The one or more cables then wrap partially around the first spool in a counterclockwise direction in order to reach point 292. According to this exemplary pattern, the first and second spools are components of a first former and the third and fourth spools are components of a second former. The one or more cables may be wrapped around the multiple-frequency RF trap in other patterns in accordance with other embodiments. However, it is important that the one or more cables wrap are wrapped in a figure-eight pattern around each of the formers.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A multiple-frequency RF trap for one or more shielded cables comprising:
    a first cylindrical member disposed around the one or more shielded cables, said first cylindrical member comprising a first conductive cylinder and a first capacitive component electrically connected to the first conductive cylinder, said first cylindrical member being electrically connected to a cable shield surrounding the one or more shielded cables;
    a second cylindrical member disposed around the first cylindrical member, said second cylindrical member comprising a second conductive cylinder and a second capacitive component electrically connected to the second conductive cylinder, said second cylindrical member being electrically connected to the cable shield; and
    an outer shield surrounding the second conductive cylinder, said outer shield being electrically connected to the cable shield.

2. The multiple-frequency RF trap of claim 1, wherein the cable shield and the first cylindrical member are separated by a first insulating layer.

3. The multiple-frequency RF trap of claim 2, wherein the first cylindrical member and the second cylindrical member are separated by a second insulating layer.

4. The multiple-frequency RF trap of claim 3, wherein at least one of the first insulating layer and the second insulating layer comprises air.

5. The multiple-frequency RF trap of claim 1, wherein the first capacitive component comprises a plurality of capacitors.

6. The multiple-frequency RF trap of claim 5, wherein the plurality of capacitors are arranged in a ring.

7. The multiple-frequency RF trap of claim 1, wherein a first circuit comprises the first cylindrical member, the cable shield and the first capacitive component is tuned to resonate at a first frequency.

8. The multiple-frequency RF trap of claim 7, wherein a second circuit comprises the second cylindrical member, the cable shield and the second capacitive component is tuned to resonate at a second frequency that is different than the first frequency.

9. The multiple-frequency RF trap of claim 8, wherein at least one of the first frequency and the second frequency corresponds to a resonant frequency of hydrogen in an MRI system.

10. The multiple-frequency RF trap of claim 8, wherein at least one of the first frequency and the second frequency corresponds to a resonant frequency of C13 in an MRI system.

11. A multiple-frequency RF trap for an MRI system comprising:
    a first former with a first conductive path in the shape of a first discontinuous figure-eight, said first former being adapted to receive one or more cables wrapped in a first figure-eight pattern;
    a first capacitive component electrically connected to the first former, said first capacitive component completing a first LC circuit with the first former, said first LC circuit being tuned to a first RF frequency;
    a second former with a second conductive path in the shape of a second discontinuous figure-eight, said second former being adapted to receive one or more cables wrapped in a second figure-eight pattern, said second former being positioned at a generally perpendicular angle to the first former; and
    a second capacitive component electrically connected to the second former, said second capacitive component completing a second LC circuit with the second former, said second LC circuit being tuned to a second RF frequency.

12. The multiple-frequency RF trap of claim 11, wherein the first former comprises a first spool.

13. The multiple-frequency RF trap of claim 12, wherein the first former further comprises a second spool connected to the first spool by a conductive strip.

14. The multiple-frequency RF trap of claim 11, wherein the first former and the second former are substantially coplanar.

15. The multiple-frequency RF trap of claim 11, wherein the first former and the second former are disposed in substantially perpendicular planes.

16. An MRI system comprising:
a superconducting coil configured to generate a B0 field;
an RF body coil disposed inside the superconducting main coil;
at least one cable connected to the RF body coil; and
a multiple-frequency RF trap affixed to the at least one cable, said multiple-frequency RF trap being tuned to block RF energy at two discrete frequency bands, wherein the multiple-frequency RF trap comprises a first cylindrical member disposed around the at least one cable, said first cylindrical member comprising a first conductive cylinder and a first capacitive component electrically connected to the first conductive cylinder.

17. The MRI system of claim 16, wherein the multiple-frequency RF trap further comprises a second cylindrical member disposed around the first cylindrical member, said second cylindrical member comprising a second conductive cylinder and a second capacitive component electrically connected to the second conductive cylinder.

18. The MRI system of claim 16, wherein the multiple-frequency RF trap comprises a first former with a first conductive path in the shape of a first discontinuous figure-eight and a second former with a second conductive path in the shape of a second discontinuous figure-eight.

19. The MRI system of claim 18, wherein the multiple-frequency RF trap further comprises a first capacitive component attached to the first former and a second capacitive component attached to the second former, said first capacitive component having a first capacitance and said second former having a second capacitance.

* * * * *